(12) United States Patent
Xing

(10) Patent No.: US 6,901,506 B2
(45) Date of Patent: *May 31, 2005

(54) MAXIMAL TILE GENERATION TECHNIQUE AND ASSOCIATED METHODS FOR DESIGNING AND MANUFACTURING VLSI CIRCUITS

(75) Inventor: Zhaoyun Xing, San Jose, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 459 days.

This patent is subject to a terminal disclaimer.

(21) Appl. No.: 10/109,125

(22) Filed: Mar. 28, 2002

(65) Prior Publication Data

US 2003/0188281 A1 Oct. 2, 2003

(51) Int. Cl.[7] .......................... G06F 11/25; G06F 17/50
(52) U.S. Cl. ............................. 712/227; 716/9; 716/13; 716/16; 714/725
(58) Field of Search ............................... 712/227; 716/5, 716/9, 13, 16; 714/30, 40, 733, 725

(56) References Cited

U.S. PATENT DOCUMENTS

| | | | | |
|---|---|---|---|---|
| 5,822,214 A | * | 10/1998 | Rostoker et al. ............. 716/10 |
| 6,071,315 A | | 6/2000 | Ramamurthi et al. ......... 716/19 |
| 6,216,257 B1 | * | 4/2001 | Agrawal et al. .............. 716/16 |
| 6,324,673 B1 | | 11/2001 | Luo et al. ..................... 716/11 |
| 6,546,529 B1 | * | 4/2003 | Dansky et al. ................. 716/5 |
| 6,763,512 B2 | * | 7/2004 | Xing ........................... 716/13 |

OTHER PUBLICATIONS

Xing et al.; U.S. Appl. No. 10/109,116; filed Mar. 28, 2002, Pub # 20030188270.

Xing et al.; U.S. Appl. No. 10/119,173; filed Apr. 8, 2002, Patent # 6,763,512.

* cited by examiner

*Primary Examiner*—Daniel Pan
(74) *Attorney, Agent, or Firm*—Meyertons Hood Kivlin Kowert & Goetzel, P.C.; B. Nöel Kivlin

(57) ABSTRACT

A non-maximal arrangement of component tiles is reconfigured into a maximal arrangement. For each identified active segment of a first span not having a matching active segment in a second span, a maximal component tile having a width generally equal to the width of the identified active segment of the first span and a height generally equal to the distance separating the first and second spans is generated. The first span is then modified by deleting the matching active segment of the first span while adding each unmatched active segment of the second span. Maximal space tiles are generated from inactive segments of the spans using a similar process. The process is then repeated for each unselected span which fails to match the modified first span.

17 Claims, 5 Drawing Sheets

MAXIMAL TILE GENERATION TECHNIQUE AND ASSOCIATED METHODS FOR DESIGNING AND MANUFACTURING VLSI CIRCUITS

CROSS REFERENCE TO RELATED APPLICATION

This application is related to U.S. patent application Ser. No. 10/109,116, now patent No. 6,813,755, entitled "Active Region Management Techniques and Associated Methods of Designing and Manufacturing VLSI Circuits", filed on even date herewith, assigned to the Assignee of the present application and hereby incorporated by reference as if reproduced in its entirety.

BACKGROUND

1. Technical Field

This relates to the design and manufacture of very large scale integrated ("VLSI") circuits and, more particularly, to a maximal tile generation technique suitable for use in conjunction with the design and manufacture of VLSI circuits.

2. Description of the Relevant Art

A VLSI circuit is typically composed of a plurality of layers, each having a plurality of generally rectangular shaped components positioned thereon, oriented in either the horizontal or vertical axis. VLSI circuit designers commonly refer to these generally rectangular shaped components as "component tiles" and to the generally rectangular shaped open spaces that surround the component tiles as "space tiles." Component tiles that are to be connected on a VLSI circuit are said to form a "net", while any component tile not connected to a particular net is considered to be an obstruction to that net. Two tiles on the same layer are said to be "adjacent" if they touch along their edges and "overlapping" if there is even a single point located within the interior of both tiles. A set of tiles positioned within a routing area is said to be "maximal" if no two tiles are either overlapping or adjacent on their left or right edges.

One step in the design of a VLSI circuit is to select the wire paths that extend through the space tiles to connect the electrically equivalent component tiles that form nets. A current technique used to determine these paths utilizes a tile expansion algorithm. More specifically, clear space around the component tiles forming a net is fractured into maximal space tiles. Adjoining ones of these maximal space tiles are used to define the most efficient tile path between two components. The path of the actual connection between the components, known as the wire path, is then defined as the route through the space tile path from the component source tile to the component destination tile.

The aforementioned technique for selecting the wire paths for a VLSI circuit design suffers from two drawbacks, both of which may add to the cost of VLSI circuits manufactured in accordance with the design. First, if defined in accordance with the above-described manner, a tile path is not necessarily the optimal tile path through the clear space. Second, since the width of a tile path is typically much larger than the width of a wire path, multiple wire paths may exist through a given tile path. If the wire path located within the tile path is arbitrarily selected, the selected wire path is not necessarily the most efficient wire path potentially located within the tile path.

SUMMARY

A method for reconfiguring a non-maximal arrangement of component tiles into a maximal arrangement thereof. In accordance therewith, active and inactive segments are identified for a plurality of spans which extend across a routing area. For each identified active segment of the first span not having a matching active segment in a second span, a maximal component tile having a width generally equal to the width of the identified active segment of the first span and a height generally equal to the distance separating the first and second spans is generated. The first span is then modified by deleting, from the first span, each identified active segment having a matching active segment in the second span. The first span is then further modified by adding, to the first span, each matching active segment from the second span. Similarly, for each identified inactive segment of the first span not having a matching inactive segment in the second span, a maximal space tile having a width generally equal to the width of the identified inactive segment of the first span and a height generally equal to the distance separating the first span and the second span is generated. The first span is the further modified by deleting, from the first span, each identified inactive segment thereof having a matching segment in the second span. Finally, the first span is still further modified by adding, to the first span, each unmatched inactive segment of the second span. Plural iterations are then executed, with the modified first span being used as the first span and a next span which fails to match the modified first span being used as the second span, until the routing area is fully populated with maximal component tiles and maximal space tiles.

DETAILED DESCRIPTION

Figure 1:
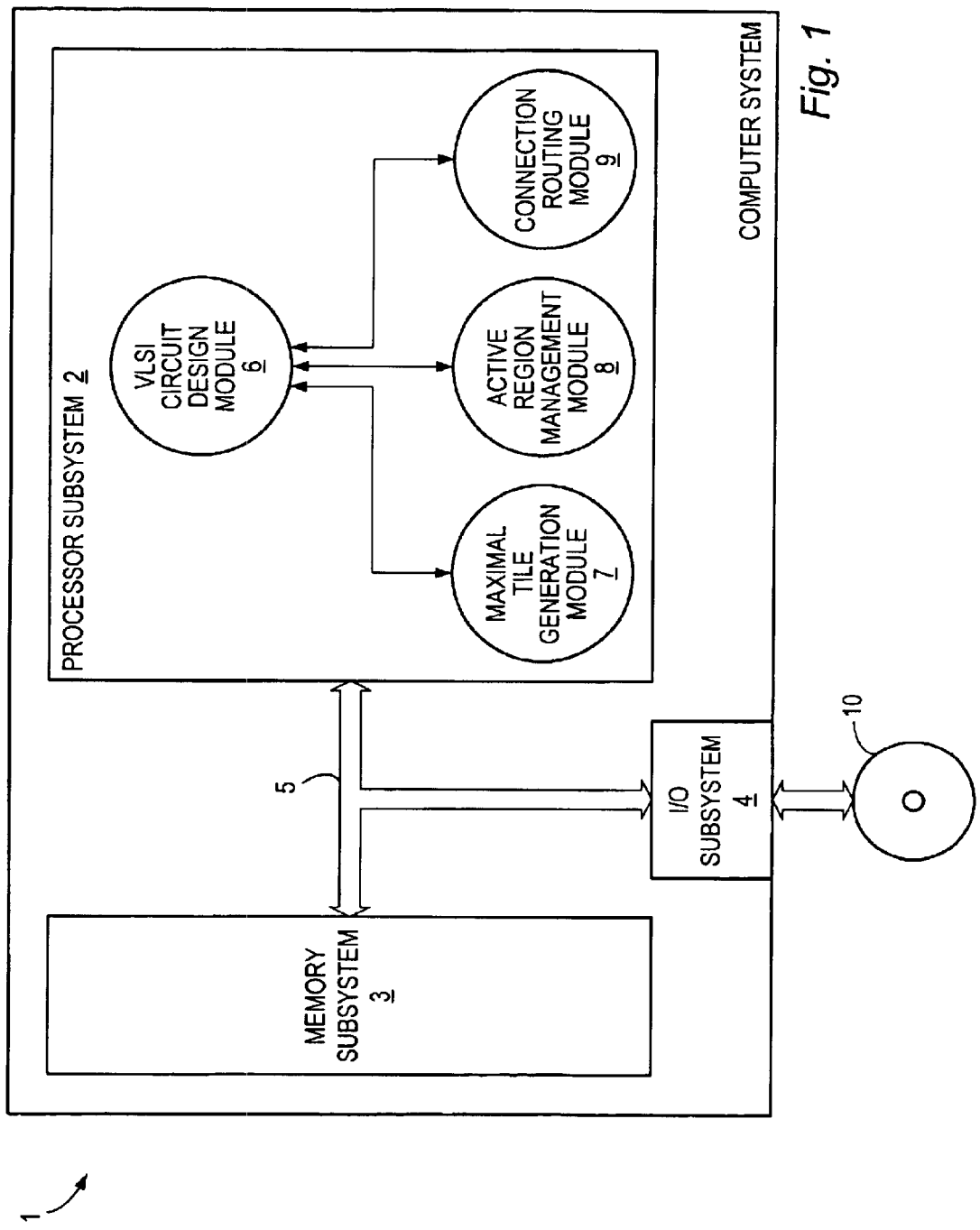
FIG. 1 is a block diagram of a computer system in which VLSI circuit design software resides.

Referring first to FIG. 1, a computer system 1, for example, a personal computer ("PC"), file server or other type of computer, in which VLSI circuit design software resides will now be described in greater detail. The computer system 1 is comprised of a processor subsystem 2, a memory subsystem 3 and an input/output ("I/O") subsystem 4 coupled together by a bus subsystem 5. The bus subsystem 5 encompasses the main system bus and any local or other types of busses that collectively couple the processor subsystem 2, the memory subsystem 3 and the I/O subsystem 4 to one another. As used herein, the terms "couple" or "coupled" refer broadly to either direct or indirect connection.

The processor subsystem 2 encompasses the collective processing capability of the computer system 1, including the central processing unit ("CPU") as well as any secondary processing devices, for example, an arithmetic processing unit, coupled to the CPU by the bus subsystem 5. Similarly, the memory subsystem 3 encompasses the collective storage capability of the computer system 1, including main, auxiliary, cache and any other memory accessible by the processor subsystem 2 via the bus subsystem 5. Finally, the I/O subsystem 4 encompasses any and all I/O devices, for example, floppy, CD-ROM or DVD drives, coupled to the bus subsystem 5, for writing data to or reading data from the processor subsystem 2 or the memory subsystem 3. The I/O subsystem 4 also encompasses any data communications equipment ("DCE"), for example, network interface cards or modems, which couple the computer system 1 to data terminal equipment ("DTE"), for example, a second PC, file server or web server, via a local area network ("LAN"), wide area network ("WAN"), intranet, internet or other type of network.

FIG. 1 further shows plural software modules, specifically, a first software module 6 for providing the computer system 1 with VLSI circuit design functionality, a second software module 7 for providing the computer system 1 with maximal tile generation functionality, a third software module 8 for providing the computer system 1 with active region management functionality and a fourth software module 9 for providing the computer system 1 with connection routing functionality. Each of the software modules 6–9 is comprised of a series of instructions which are encoded in the memory subsystem 3 as computer readable program code and executable by the processor subsystem 2. Typically, the VLSI circuit design module 6, the maximal tile generation module 7, the active region management module 8 and the connection routing module 9 will be stored in the auxiliary memory of the memory subsystem 3 prior to the execution thereof by the processor subsystem 2. A transportable computer usable medium 10, for example, a floppy disk, CD-ROM or file transfer software, is used to copy the VLSI circuit design module 6, the maximal tile generation module 7, the active region management module 8 and the connection routing module 9 into the auxiliary memory of the memory subsystem 3.

As illustrated in FIG. 1, the functionality provided by the software modules 6–9 may be encoded in the memory subsystem 3 and/or the computer usable medium 10 as discrete computer programs, each containing computer readable program code. Alternately, the functionality provided by the software modules 6–9 may be encoded in the memory subsystem 3 and/or the computer usable medium 10 as separate subroutines of a single computer program containing plural computer readable program subcodes. Furthermore, while any of the software modules 6–9 may be executed separately, typically, the VLSI circuit design module 6 will be initially executed by the processor subsystem 3. The VLSI circuit design module 6 will then periodically call selected ones of the maximal tile generation module 7, the active region management module 8 and the connection routing module 9 to perform certain functions during the design of a VLSI circuit. Of course, any one of the software modules 6–9 may call any other one of the software modules 6–9 to perform certain functions on its behalf.

Figure 2:
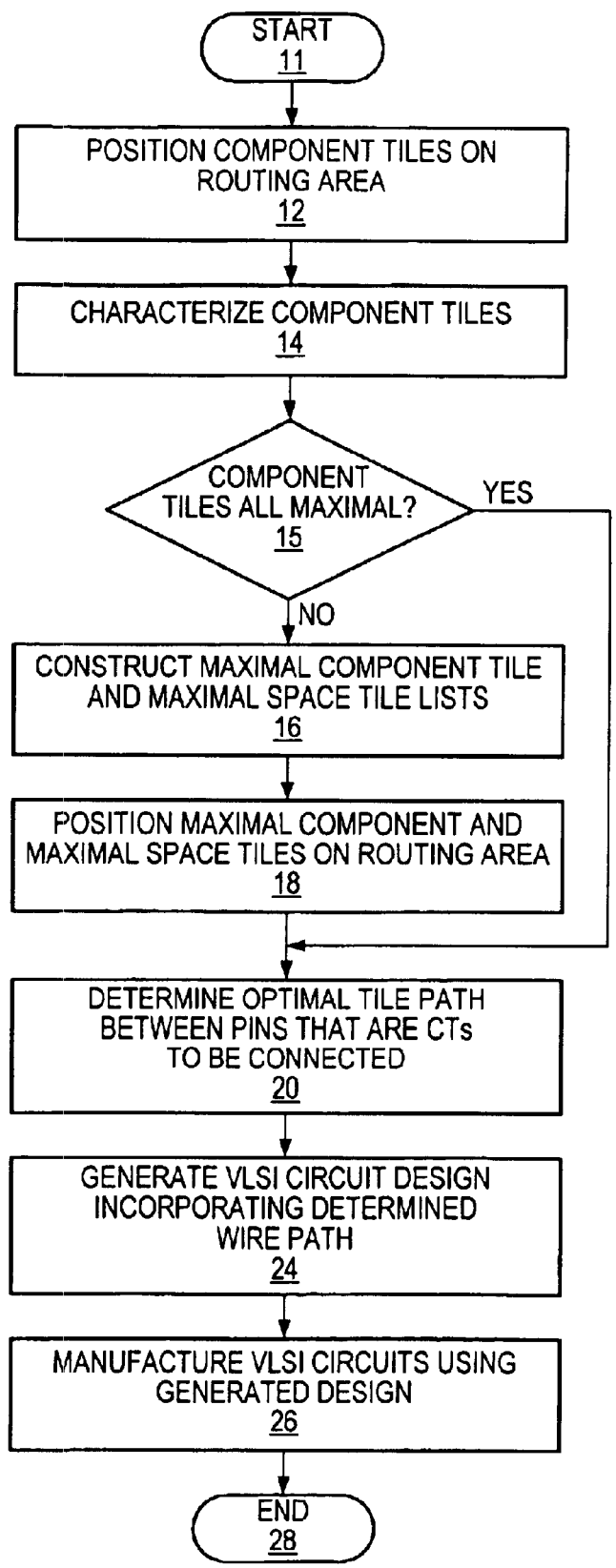
FIG. 2 is a flow chart of a method for designing and manufacturing VLSI circuits.
Figure 4:
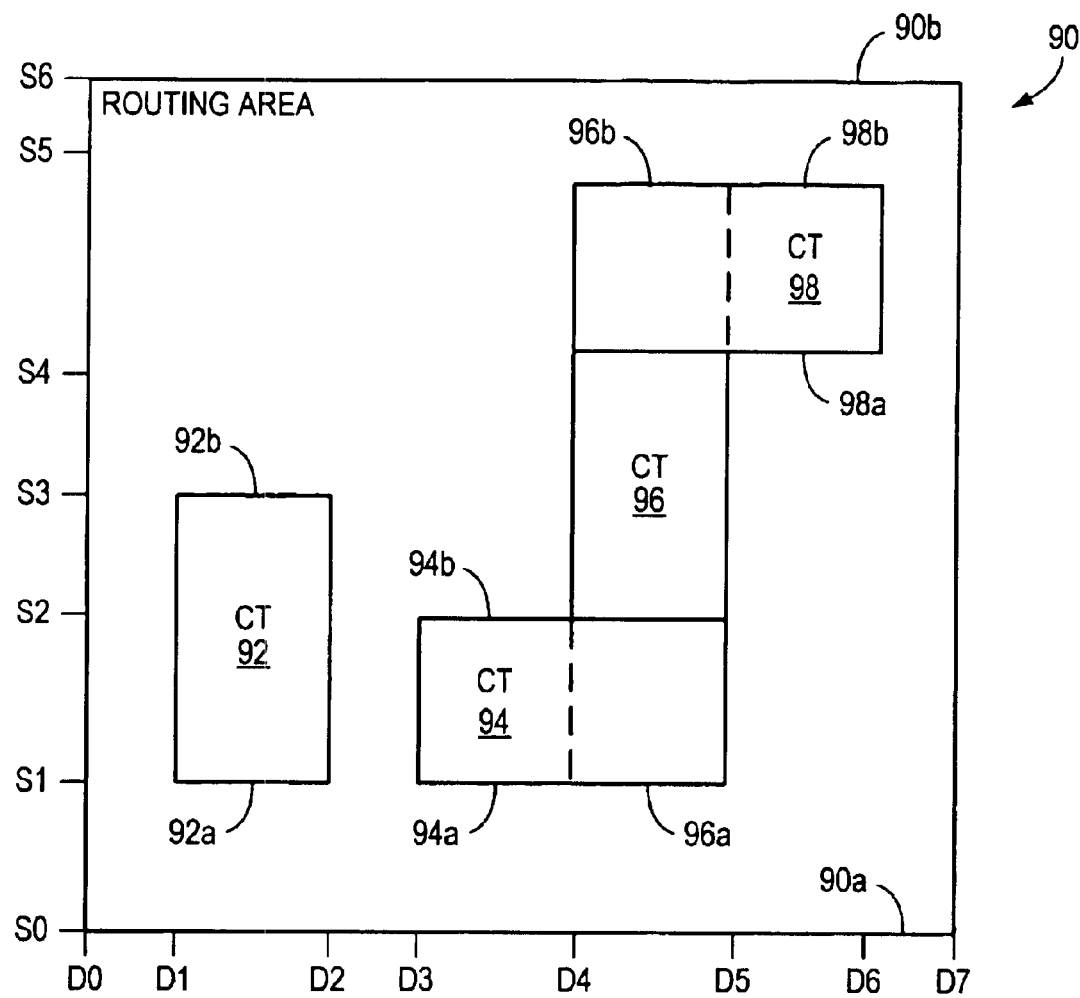
FIG. 4 is a top view of a routing area having plural component tiles located thereon.

Referring next to FIG. 2, a method for designing and manufacturing VLSI circuits will now be described in greater detail. The method commences at step 11 with the execution of the VLSI circuit design module 6 by the processor subsystem 2. The method proceeds to step 12 where a routing area is defined and a collection of component tiles are positioned thereon using the VLSI circuit design module 6. Generally, the routing area comprises the surface area of a layer of an integrated circuit on which component tiles are positioned. For example, FIG. 4 illustrates component tiles ("CTs") 92, 94, 96 and 98 positioned within a routing area 90. While, in the description which follows, the routing area 90 is oftentimes described with respect to a vertical axis, hereafter termed the "S" axis, which extends from S0 to S6 and a horizontal axis, hereafter termed the "D" axis, which extends from D0 to D7, it should be clearly understood that the use of these terms is not intended to imply or suggest that the routing area 90 has a particular orientation, either horizontal or vertical, relative to the VLSI circuit being designed. Likewise, the description of a first span (or segment thereof) of the routing area 90 as being located above or below a second span (or segment thereof) is not intended to imply or suggest that the first and second spans are oriented in either the horizontal or vertical plane. Rather, the use of these terms is merely intended to describe their relative location within a common plane without regard to the specific orientation of that plane.

Proceeding on to step 14, the CTs 92, 94, 96 and 98 are characterized as either maximal component tiles or non-maximal component tiles. In the example illustrated in FIG. 4, the CT 92 is a maximal component tile because there are no overlapping tiles or adjacent tiles on either the left or right sides. In contrast, the CTs 94, 96 and 98 are all non-maximal component tiles. Specifically, the CT 94 is a non-maximal component tile because the CT 96 is adjacent to it on a right edge thereof. Similarly, the CT 98 is a non-maximal component tile because the CT 96 is adjacent to it on a left edge thereof. Finally, the CT 96 is a non-maximal component tile because the CT 94 is adjacent to it on a portion of a left edge thereof and the CT 98 is adjacent to it on a portion of a right edge thereof.

Continuing on to step 15, if all of the CTs 92, 94, 96 and 98 are maximal component tiles, the method proceeds to step 20 for continued design and manufacture of the VLSI circuit. If, however, all of the CTs 92, 94, 96 and 98 are not maximal component tiles, the maximal tile generation module 7 is executed to reconfigure the non-maximal arrangement of the CTs 92, 94, 96 and 98 into a maximal component tile arrangement. Accordingly, the method proceeds to step 16 for construction of a maximal component tile list and a maximal space tile list. The method of constructing the maximal component tile list and the maximal space tile list is described in greater detail below with respect to FIG. 3. The method then proceeds on to step 18 where the maximal component tile and maximal space tile lists constructed at step 16 are used to position the maximal component tiles and the maximal space tiles on the routing area 90.

After reconfiguring the CTs 92, 94, 96 and 98 on the routing area 90 into a maximal arrangement at step 18 or after having determined that all of the CTs 92, 94, 96 and 98 were initially positioned in a maximal arrangement at step 15, the method proceeds to step 20 where the connection routing module 9 determines the optimal tile path, using space tiles, between pins that are CTs to be connected. Using the optimal tile path between pins that are CTs to be connected, the method continues on to step 24 where the positions of the CTs 92, 94, 96 and 98 and the wire path interconnecting the connected CTs are used by the VLSI circuit design module 6 to produce a VLSI circuit design. In this regard, it should be noted that the above-described technique provides the position for a single layer in either the horizontal or vertical plane of the VLSI circuit being designed. As VLSI circuits are typically multi-layer, the described process is repeated for each layer of the VLSI circuit in the selected plane. Furthermore, as a multi-layer VLSI typically includes connection paths along both of the horizontal and vertical planes, the described process would also need to be repeated for each layer in the other one of the horizontal and vertical planes for which a connection path is needed. It should be noted, however, that the foregoing description of a method of designing a VLSI circuit is highly simplified and that numerous steps in the process which are deemed as not being needed for an understanding of the disclosed techniques have been omitted for ease of description. Having completed the design of the VLSI circuit, the method then continues on to step 26 where plural VLSI circuits which conform to the design are manufactured at a facility using conventional manufacturing processes. The method then ends at step 28.

Figure 3:
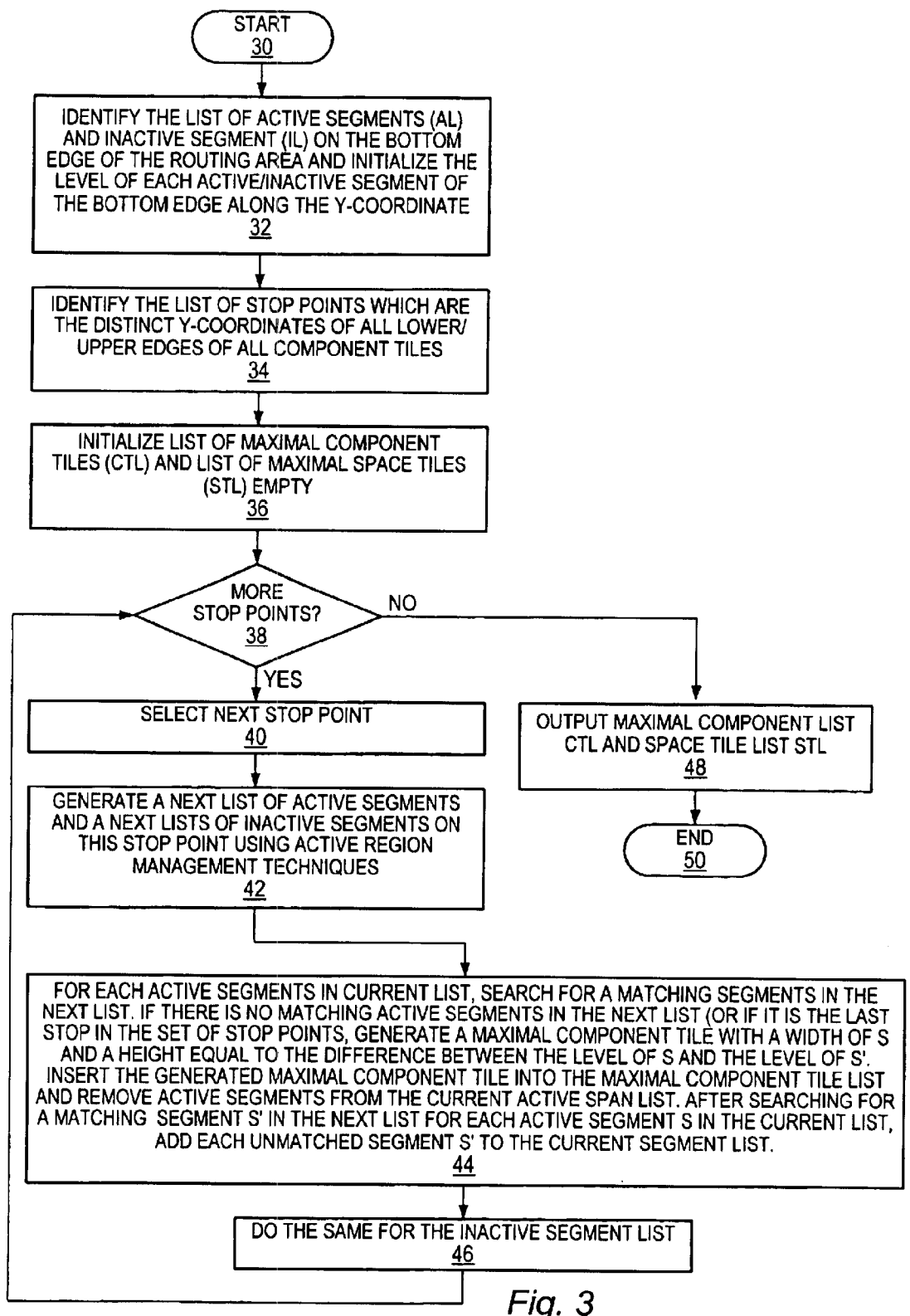
FIG. 3 is a flow chart of a method, suitable for use in conjunction with the method of FIG. 2, for reconfiguring a non-maximal arrangement of component tiles located within a routing area into a maximal arrangement thereof.

Referring next to FIG. 3, the method by which maximal component tile and maximal space tile lists are determined at step 16 will now be described in greater detail. The method commences at step 30 and, at step 32, a list (AL) of active segments and a list (IL) of inactive segments of a span which extends along a bottom edge of the routing area 90 are identified. Generally, an "active" segment of a span is a segment which passes through the interior of a component tile or along a lower edge thereof. Conversely, an "inactive" segment of a span is a segment that passes through an unoccupied portion of the routing area or along an upper edge of a component tile. Once active and inactive segments of the span have been identified, a level is then assigned to each segment thereof. The level of a segment is the point, along the S axis, generally aligned with the span of which the active or inactive segment forms a portion thereof. For example, a segment forming part of a span may be described as follows: [DX, DY, SZ] where DX is the point, along the D axis, where the active or inactive segment starts, DY is the point, along the D axis, where the active or inactive segment ends and SZ is the level, along the S axis, of the active or inactive span of which the active or inactive segment forms a portion thereof.

An active segment of a first span may be said to "match" an active segment of a second span if the segments have the same start point DX and the same stop point DY along the D axis but different levels SZ along the S axis. For example, the active segments [D1, D3, S1] and [D1, D3, S2] are considered to be matching active segments. Conversely, the term "unmatched" active segments refer to spans which, in addition to having different levels SZ, also have different start points DX, different stop points DY or both. Likewise, an inactive segment of a first span matches an inactive segment of a second span if the segments have the same start and stop points DX and DY but different levels SZ while unmatched inactive segments also have either a different start point DX, a different stop point DY or both.

A "characteristic" of a span is defined by the set of segments which comprises the span. A pair of spans may be deemed as having the same characteristic if every active and inactive segment of a first span of the span pair has a matching active or inactive segment, respectively, in a second one of the span pair. Conversely, a pair of spans may be deemed as having different characteristics if every active and inactive segment of the first span fails to have a matching active or inactive segment, respectively, in the second span.

As may be clearly seen in FIG. 4, neither a lower edge nor an interior of a component tile extends along the bottom edge of the routing area 90. Accordingly, the bottom edge of the routing area 90 has a span comprised of a single inactive segment which extends from D0 to D7. As may be further seen in FIG. 4, the level of the span is S0. The level of the span is hereby designated as a first stop point S0 for a set of stop points for the routing area 90 and the list of active and inactive segments of the span which extends along the bottom edge of the routing area 90 and is generally aligned with the first stop point S0 may be described as follows:

AL=Φ; and

IL={[D0, D7, S0]}.

The list of ALs and the list of ILs for the span generally aligned with the first stop point S0 are hereby designated as a current list of ALs and a current list of ILs, respectively, for the routing area 90.

Continuing on to step 34, additional members of the set of stop points for the routing area 90 are identified. These additional stop points for the routing area 90 are those points along the S axis which are generally aligned with either a lower edge of one or more of the CTs 92, 94, 96 and 98 and/or an upper edge of one or more of the CTs 92, 94, 96 and 98. Thus, from the known arrangement of the CTs 92, 94, 96 and 98 illustrated in FIG. 4, the maximal tile generation module 7 identifies, in an ascending order relative to the S axis, S1, S2, S3, S4 and S5 as additional members of the set of stop points for the routing area 90. Finally, an upper edge of the routing area 90 is designated as a last stop point S6 of the set of stop points for the routing area 90. The method then proceeds to step 36 where an empty list of maximal component tiles (CTL) and an empty list of maximal space tiles (STL) are generated.

S1, S2, S3, S4, S5 and S6 were identified as additional stop points because they are all aligned with one or more of the lower edges of the CTs 92, 94, 96 and 98, the upper edges of the CTs 92, 94, 96 and 98 and/or the upper edge of the routing area 90. The edges of the CTs 92, 94, 96 and 98 are used to identify additional stop points since the edges of a CT indicate transition between active and inactive regions. More specifically, a lower edge of a CT indicates the location of an inactive-to-active transition while an upper edge of a CT indicates the location of an active-to-inactive transition. The stop points are selected to coincide with either inactive-to-active or active-to-inactive transitions because, in accordance with the techniques disclosed herein and to be more fully described below, maximal component and/or space tiles are generated whenever active and/or inactive segments of a first span fails to have a matching active and/or inactive segments along a second span.

At step 38, it is determined whether there are additional stop points which require examination. If so, the method proceeds to step 40 for selection of a next stop point for examination. At step 42, a next list of active segments and a next list of inactive segments are identified for a next span generally aligned with a next stop point of the set of stop points. The lists of active and inactive segments of the span generally aligned with the next stop point are generated using the active region management techniques disclosed in U.S. patent application Ser. No. 10/109,116, now Pat. No. 6,813,755, and previously incorporated by reference. Once the next list of active segments and the next list of inactive segments of the span generally aligned with the next stop point have been generated at step 42, the method proceeds to step 44 where the next list of active segments is compared to the current list of active segments and, based upon that comparison, one or more maximal component tiles may be identified for inclusion in the list of maximal component tiles.

More specifically, for each active segment S in the current list of active segments, the next list of active segments is examined for a matching active segment S'. If there is no matching active segment S' in the next list of active segments, a maximal component tile having a width generally equal to the width [DX, DY] of the active segment S and a height generally equal to the difference between the level of the active segment S and the level of the active segment S' is generated. The generated maximal component tile is then inserted into the maximal component tile list CTL and the active segment S removed from the current list of active segments. After searching for a matching active segment S' in the next active segment list for each active segment S in the current active segment list, any unmatched active segment S' in the next active segment list is added to the current active segment list. Initially, the current active segment list will contain active segments at only one level. It should be noted, however, as the next active segment lists for various levels are examined, the current active segment list will likely contain active segments at plural levels.

The method then proceeds to step 46 where the process of step 45 is repeated using the current and next list of inactive segments. By doing so, one or more maximal space tiles may be generated at step 44 and added to the maximal space tile list STL. Additionally, the current list of inactive segments will be modified by deleting the inactive segments, from the current list of inactive segments, the inactive segments having a matching inactive segment in the next list of inactive segments and by adding, to the current list of inactive segments, unmatched inactive segments from the next list of inactive segments. The method then returns to step 38 where the process described in steps 40, 42, 44 and 46 is repeated for each stop point in the set of stop points. After the last stop point in the set of stop points has been processed, the method will proceed from step 38 to step 48 where the maximal component tile list CTL and the maximal space tile list STL generated by the described method are output, typically, to the VLSI circuit design module 8 for use in connection with the design and manufacture of a VLSI circuit in accordance with the method of FIG. 2.

Figure 5:
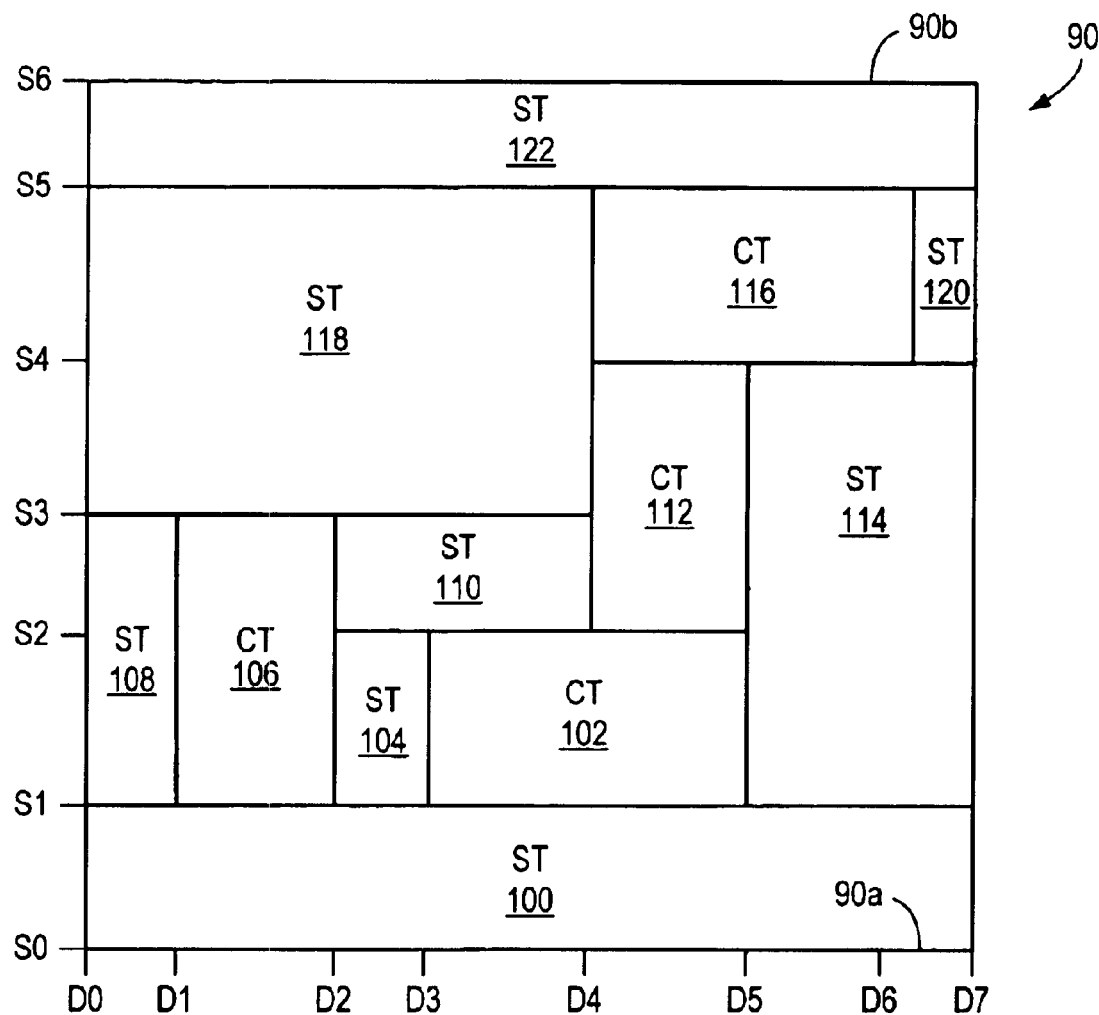
FIG. 5 is a top view of the routing area of FIG. 4 which shows an arrangement of maximal component and space tiles generated in accordance with the method of FIG. 3 and fully populating the routing area.

The above-described method of generating a list of maximal component tiles CTL and a list of maximal space tiles STL for the routing area 90 shall again be described, now with respect to the example illustrated in FIGS. 4 and 5. As previously noted, FIG. 4 shows the CTs 92, 94, 96 and 98 positioned in the routing area 90 in a non-maximal tile arrangement. However, by applying the process set forth in FIG. 3 to the non-maximal component tile arrangement of FIG. 4, the component tiles are re-configured into the maximal tile arrangement illustrated in FIG. 5. As previously set forth, the process starts at step 32 by identifying the active and inactive segments for a span extending along a bottom edge 90a of the routing area 90. As there are no active segments along the bottom edge 90a, the active and inactive segment lists for this span, which is generally aligned with the stop point S0, are initially set as follows:

AL=Φ; and

IL={[D0, D7, S0]}.

At step 34, the remaining members of the set of stop points are identified (S1, S2, S3, S4, S5 and S6) and, at step 36, an empty maximal component tile list CTL and an empty maximal space tile list STL are generated. As the stop points S1 through S6 need to be examined, the method passes through 38 and on to step 40 where the stop point S1, the next stop point after the stop point S0, is selected for examination. As may be seen in FIG. 4, bottom edges 92a, 94a and 96a of the CTs 92, 94 and 96, respectively, are generally aligned with the stop point S1. The corresponding segments are, therefore, considered to be active while the remaining segments generally aligned with the stop point S1 are considered to be inactive. Accordingly, at step 42, the next list of active segments and the next list of inactive segments are determined to be:

AL={[D1, D2, S1], [D3, D5, S1]}; and

IL={[D0, D1, S1],[D2, D3, S1], [D5, D7, S1]}.

Proceeding to step 44, the current active segment list is empty. As a result, there are no matches between the current list of active segments and the next list of active segments. As a result, no maximal component tiles are generated at step 44. Furthermore, as both entries in the next active segment list are unmatched, they are added to the current active segment list, which now becomes:

AL={[D1, D2, S1], [D3, D5, S1]}.

The method then proceeds to step 46 for processing of the current inactive segment list. The current inactive segment list contains a single entry [D0, D1, S0]. As there is no matching span in the next inactive segment list, a space tile, hereafter referred to as ST 100 and illustrated in FIG. 5, which extends from D0 to D7 in the D axis along a line generally aligned with S0 and which extends from S0 to S1 in the S axis is generated and added to the maximal space tile list STL. The matched entry [D0, D1, S0] is deleted from the current inactive segment list and the unmatched entries [D0, D1, S1], [D2, D3, S1] and [D5, D7, S1] of the next inactive segment list are added to the inactive segment list, thereby producing the following current inactive segment list:

IL={[D0, D1, S1], [D2, D3, S1], [D5, D7, S1]}.

The method then returns to step 38 and, as there are additional stop points to be examined, on to step 40 where stop point S2 is selected for examination.

A span extending across the routing area 90 along a line generally aligned with the stop point S2 passes through the interior of the CT 92, along an upper edge 94b of the CT 94 and through the interior of the CT 96. Accordingly, the next list of active and inactive segments would be as follows AL={[D1, D2, S2], [D4, D5, S2]}; and

IL={[D0, D1, S2], [D2, D4, S2],[D5, D7, S2]}.

For each active segment in the current active segment list, the next active segment list is searched for matches. Here, the [D1, D2, S1] entry from the current active segment list matches the [D1, D2, S2] entry from the next active segment list while the [D3, D5, S1] entry from the current active segment list is unmatched. Accordingly, a maximal component tile, hereafter referred to as CT 102 and illustrated in FIG. 5, which extends from D3 to D5 in the D axis along a line generally aligned with S1 and which extends from S1 to S2 in the S axis is generated and added to the maximal component tile list CTL. The matched entry [D3, D5, S 1] is then deleted from the current active segment list while the unmatched entry [D4, D5, S2] from the next active segment list is added to the current active segment list, thereby producing the following current active segment list:

AL={[D1, D2, S1], [D4, D5, S2]}.

The method then proceeds to step 46 for processing of the current inactive segment list. The current inactive segment list contains entries [D0, D1, S1], [D2, D3, S1] and [D5, D7, S1] while the next inactive segment list contains entries [D0, D1, S2], [D2, D4, S2] and [D5, D7, S2]. Thus, the [D0, D1, S1] and [D5, D7, S1] entries of the current inactive segment list are matched while the [D2, D4, S2] entry is unmatched. Accordingly, maximal space tile ST 104, which extends from D2 to D3 in the D axis along a line generally aligned with S1, extends from S1 to S2 in the S axis and is illustrated in FIG. 5, is generated and added to the maximal space tile list STL. The matched entry is then deleted from the current inactive segment list while the unmatched entry [D2, D4, S2] of the next inactive segment list is added to the current inactive segment list, thereby producing the following current inactive segment list:

IL={[D0, D1, S1], [D2, D4, S2], [D5, D7, S1]}.

A span extending across the routing area 90 along a line generally aligned with the stop point S3 passes along an upper edge 92*b* of the CT 92 and through the interior of the CT 96. Accordingly, the next list of active and inactive spans would be as follows:

AL={[D4, D5, S3]}; and

IL={[D0, D4, S3], [D5, D7, S3]}.

For each active span in the current active segment list, the next active segment list is searched for matches. Here, the entry [D4, D5, S1] matches the entry [D4, D5, S3] while the entry [D1, D2, S1] is unmatched. Accordingly, the entry [D1, D2, S1] is used to generate a maximal component tile, hereafter referred to as CT 106 and illustrated in FIG. 5, which extends from D1 to D2 in the D axis along a line generally aligned with S1 and from S1 to S3 in the S axis. The newly generated maximal component tile is then added to the maximal component tile list CTL. The matched entry [D1, D2, S1] is deleted from the current active segment list and, since there are no unmatched entries from the next active segment list, the following current active segment list is produced:

AL={[D4, D5, S2]}.

The method then proceeds to step 46 for processing of the current inactive segment list. The current inactive segment list contains entries [D0, D1, S1], [D2, D4, S2] and [D5, D7, S1] while the next inactive segment list contains entries [D0, D4, S3] and [D5, D7, S3]. Thus, the [D5, D7, S1] entry of the current inactive segment list is matched while the [D0, D1, S1] and [D2, D4, S2] entries of the current inactive segment list are unmatched. Accordingly, the unmatched entry [D0, D1, S1] is used to generate maximal space tile ST 108, which extends from D0 to D1 in the D axis along a line generally aligned with S1, extends from S1 to S3 in the S axis and is illustrated in FIG. 5. Furthermore, the unmatched entry [D2, D4, S2] is used to generate maximal space tile ST 110, which extends from D2 to D4 in the D axis along a line generally aligned with S2, extends from S2 to S3 in the S axis and is illustrated in FIG. 5. The newly generated tiles are then added to the maximal space tile list, the unmatched entries [D0, D1, S1] and [D2, D4, S2] are deleted from the current inactive segment list and the unmatched entry [D0, D4, S3] of the next inactive segment list is added to the current inactive segment list, thereby producing the following current inactive segment list:

IL={[D0, D4, S3], [D5, D7 S1]}.

The method then returns to step 38 and, as there are additional stop points to be examined, on to step 40 where stop point S4 is selected for examination.

A span extending across the routing area 90 along a line generally aligned with the stop point S4 extends through the interior of the CT 96 and along a lower edge 98*a* of the CT 98. Accordingly, the next list of active and inactive spans generated at step 42 would be as follows:

AL={[D4, D6, S4]}; and

IL={[D0, D4, S4], [D6, D7, S4]}.

The current and next active segment lists are then processed at step 44. The current active segment list is [D4, D5, S2] while the next active segment list is [D4, D6, S4]. Thus, there are no matches between the current and next active segment lists. Accordingly, the entry [D4, D5, S2] of the current active segment list is used to generate a maximal component tile, hereafter referred to as CT 112 and illustrated in FIG. 5, which extends from D4 to D5 in the D axis along a line generally aligned with S2 and from S2 to S4 in the S axis. The newly generated maximal component tile is then added to the maximal component tile list CTL. The unmatched entry [D4, D5, S2] is then deleted from the current active segment list and the unmatched entry [D4, D6, S4] from next active segment list is added to the current active segment list to produce the following current active segment list:

AL={[D4, D6, S4]}.

The method then proceeds to step 46 for processing of the current inactive segment list. The current inactive segment list contains entries [D0, D4, S1] and [D5, D7, S1] while the next inactive segment list contains entries [D0, D4, S4] and [D6, D7, S4]. Thus, the [D0, D4, S1] entry of the current inactive segment list is matched to the entry [D0, D4, S4] entry of the next inactive segment list while the [D5, D7, S1] entry of the current inactive segment list and the [D6, D7, S4] entry of the next inactive segment list are unmatched. Accordingly, the unmatched entry [D5, D7, S1] of the current active span is used to generate maximal space tile ST 114, which extends from D5 to D7 in the D axis along a line generally aligned with S1, extends from S1 to S4 in the S axis and is illustrated in FIG. 5. The newly generated space tile is then added to the maximal space tile list STL, the unmatched entry [D5, D7, S1] is deleted from the current inactive segment list and the unmatched entry [D6, D7, S4] of the next inactive segment list is added to the current inactive segment list, thereby producing the following current inactive segment list:

IL={[D0, D4, S3], [D6, D7 S4]}.

The method then returns to step 38 and, as there are additional stop points to be examined, on to step 40 where stop point S5 is selected for examination.

A span extending across the routing area 90 along a line generally aligned with the stop point S5 passes through along the upper edges of the CTs 96 and 98. Accordingly, the next list of active and inactive spans generated at step 42 would be as follows:

AL=Φ; and

IL={[D0, D7, S5]}.

The current and next active segment lists are then processed at step 44. The current active segment list is [D4, D6, S4] while the next active segment list is Φ. Thus, there are no matches between the current and next active segment lists. Accordingly, the entry [D4, D5, S4] of the current active segment list is used to generate a maximal component tile, hereafter referred to as CT 116 and illustrated in FIG. 5, which extends from D4 to D6 in the D axis along a line generally aligned with the stop point S4 and from the stop point S4 to the stop point S5 in the S axis. The newly generated maximal component tile is then added to the maximal component tile list CTL. The unmatched entry [D4, D6, S4] is then deleted from the current active segment list and, since the next active segment list is empty, the current active segment list becomes empty as well.

The method then proceeds to step 46 for processing of the current inactive segment list. The current inactive segment list contains entries [D0, D4, S3] and [D6, D7, S4] while the next inactive segment list contains the entry [D0, D7, S5]. Thus, the [D0, D4, S4] and [D6, D7, S4] entries of the current inactive segment list and the [D0, D7, S5] entry of the next inactive segment list are unmatched. Accordingly, the unmatched entry [D0, D4, S3] of the current inactive span is used to generate maximal space tile ST 118, which extends from D0 to D4 in the D axis along a line generally aligned with S3 and which extends from S3 to S5 in the S axis while the unmatched entry [D6, D7, S4] of the current inactive span is used to generate maximal space tile ST 120 which extends from D6 to D7 in the D axis along a line generally aligned with S4 and which extends from S4 to S5 in the S axis. The newly generated space tiles ST 118 and ST120, both of which are illustrated in FIG. 5, are then added to the maximal space tile list STL, the unmatched entries [D0, D4, S3] and [D6, D7, S4] are deleted from the current inactive segment list and the unmatched entry [D0, D7, S5] of the next inactive segment list is added to the current inactive segment list, thereby producing the following current inactive segment list:

IL={[D0, D7, S5]}.

The method then returns to step 38 and, as there are additional stop points to be examined, on to step 40 where the stop point S6 is selected for examination.

A span extending across the routing area 90 along a line generally aligned with the stop point S6 passes along the upper edge 90*b* of the routing area 90. As neither a lower edge nor an interior of a component is positioned along the upper edge 90*b*, the next list of active and inactive spans generated at step 42 would be as follows:

AL=Φ; and

IL={[D0, D7, S6]}.

The current and next active segment lists are then processed at step 44. The current active segment list is Φ while the next active segment list is Φ. As both the current and next active segment lists are empty, no additional maximal component tiles are generated and the current active segment list remains empty.

The method then proceeds to step 46 for processing of the current inactive segment list. The current inactive segment list contains the entry [D0, D7, S5] while the next inactive segment list contains the entry [D0, D7, S6]. While the current and inactive segment lists contain matching entries, the stop point being examined is the last stop point in the set of stop points. Accordingly, the [D0, D7, S5] entry of the current inactive segment list is used to generate a maximal space tile, hereafter referred to as maximal space tile 122, which extends from D0 to D7 in the D axis along a line generally aligned with S5, extends from S5 to S6 in the S axis and is illustrated in FIG. 5. The newly generated space tile is added to the maximal space tile list STL and the entry [D0, D7, S5] of the current inactive segment list is deleted therefrom, thereby emptying it. Further, as the entry [D0, D7, S6] was matched to the entry [D0, D7, S5], it is not added to the current inactive segment list, thereby keeping the current inactive segment list empty.

The method then returns to step 38 and as all of the stop points S0 through S7 have been examined, to step 48 for output of the generated maximal component tile and maximal space tile lists CTL and STL. The method then ends at step 50.

Thus, there has been described and illustrated herein, a maximal tile generation technique suitable for use in conjunction with the design and manufacture of VLSI circuits. However, those skilled in the art should recognize that numerous modifications and variations may be made in the techniques disclosed herein without departing substantially from the spirit and scope thereof, which is defined solely by the claims appended hereto.

What is claimed is:

1. For a routing area having a plurality of component tiles positioned thereon in a non-maximal arrangement, a method for reconfiguring said plurality of component tiles into a maximal arrangement, comprising:

characterizing a first span which extends across said routing area;

identifying a next span which extends across said routing area and has a characterization different from said first span;

generating one or more maximal component tiles and/or one or more maximal space tiles based upon differences between said characterization of said first span and said characterization of said next span;

recharacterizing said first span based upon said generated maximal component tiles and said generated maximal space tiles; and repeatedly identifying a next span, generating one or more component tiles and/or maximal space tiles and recharacterizing said first span until said routing area is fully populated with maximal component tiles and maximal space tiles.

2. The method of claim 1, wherein characterizing a first span across said routing area further comprises identifying active segments of said first span.

3. The method of claim 2, wherein generating one or more maximal component tiles and/or maximal space tiles further comprises:

identifying active segments of said next span;

for each identified active segment of said first span, determining if an active segment of said next span matches said identified active segment of said first span; and for each identified active segment of said first span not having a matching active segment in said next span, generating a maximal component tile having a width generally equal to the width of said identified active segment of said first span and a height generally equal to the distance separating said first span and said next span.

4. The method of claim 2, wherein recharacterizing said first span based upon said generated maximal component tiles and said generated maximal space tiles further comprises:

deleting, from said first span, each identified active segment having a matching active segment in said next span; and adding, to said first span, each unmatched active segment of said next span.

5. The method of claim 1, wherein characterizing a first span across said routing area further comprises identifying inactive segments of said first span.

6. The method of claim 5, wherein generating one or more maximal component tiles and/or maximal space tiles further comprises:
   identifying inactive segments of said next span;
   for each identified inactive segment of said first span, determining if an inactive segment of said next span matches said identified inactive segment of said first span; and
   for each identified inactive segment of said first span not having a matching inactive segment in said next span, generating a maximal space tile having a width generally equal to the width of said identified inactive segment of said first span and a height generally equal to the distance separating said first span and said next span.

7. The method of claim 6, wherein recharacterizing said first span based upon said generated maximal component tiles and said generated maximal space tiles further comprises:
   deleting, from said first span, each identified inactive segment having a matching inactive segment in said next span; and
   adding, to said first span, each unmatched inactive segment of said next span.

8. The method of claim 1, wherein characterizing a first span across said routing area further comprises identifying active and inactive segments of said first span.

9. The method of claim 8, wherein generating one or more maximal component tiles and/or maximal space tiles further comprises:
   identifying active and inactive segments of said next span;
   for each identified active segment of said first span, determining if an active segment of said next span matches said identified active segment of said first span;
   for each identified active segment of said first span not having a matching active segment in said next span, generating a maximal component tile having a width generally equal to the width of said identified active segment of said first span and a height generally equal to the distance separating said first span and said next span;
   for each identified inactive segment of said first span, determining if an inactive segment of said next span matches said identified inactive segment of said first span; and
   for each identified inactive segment of said first span not having a matching inactive segment in said next span, generating a maximal space tile having a width generally equal to the width of said identified inactive segment of said first span and a height generally equal to the distance separating said first span and said next span.

10. The method of claim 9, wherein recharacterizing said first span based upon said generated maximal component tiles and said generated maximal space tiles further comprises:
    deleting, from said first span, each identified active segment having a matching active segment in said next span;
    adding, to said first span, each unmatched active segment of said next span;
    deleting, from said first span, each identified inactive segment having a matching inactive segment in said next span; and
    adding, to said first span, each unmatched inactive segment of said next span.

11. A method of designing a VLSI circuit, comprising:
    generating a plurality of layers of a VLSI circuit design, each layer of said VLSI circuit design having a plurality of component tiles configured in a non-maximal arrangement;
    reconfiguring each one of said plurality of layers of said VLSI circuit design such that said plurality of component tiles are in a maximal arrangement;
    wherein reconfiguring each one of said plurality of layers further comprises:
    (a) selecting a first span which extends across said layer along a first boundary thereof, said first span having a first characteristic;
    (b) identifying active and inactive segments of said first span;
    (c) selecting a second span which extends, across said layer, generally parallel to and spaced apart from said first span, said second span having a second characteristic different from said first characteristic;
    (d) identifying active and inactive segments of said selected span;
    (e) for each identified active segment of said first span, determining if an active segment of said selected span matches said identified active segment of said first span;
    (f) for each identified active segment of said first span not having a matching active segment in said selected span, generating a maximal component tile having a width generally equal to the width of said identified active segment of said first span and a height generally equal to the distance separating said first span and said selected span;
    (g) modifying said first span by:
      (g-1) deleting, from said first span, each identified active segment having a matching active segment in said selected span;
      (g-2) adding, to said first span, each unmatched active segment of said selected span;
    (h) for each identified inactive segment of said first span, determining if an inactive segment of said selected span matches said identified inactive segment of said first span;
    (h) for each identified inactive segment of said first span not having a matching inactive segment in said selected span, generating a maximal space tile having a width generally equal to the width of said identified inactive segment of said first span and a height generally equal to the distance separating said first span and said selected span;
    (i) modifying said first span by:
      (i-1) deleting, from said first span, each identified inactive segment having a matching inactive segment in said selected span; and
      (i-2) adding, to said first span, each unmatched inactive segment of said selected span;
    (j) repeating (c) through (i-2) above for each unselected span extending across said layer generally parallel to and spaced apart from said first span and having a characteristic different than a characteristic of said modified first span;
    (k) selecting a third span which extends across said layer along a second boundary thereof, said second boundary of said layer being generally parallel with said first boundary of said layer;

(l) repeating (d) through (i-2) above for said third span.

12. A computer system, comprising:

a memory subsystem;

a processor subsystem;

a bus subsystem, said bus subsystem coupling said memory subsystem and said processor subsystem for the exchange of signals therebetween; and a VLSI circuit design module, said VLSI circuit design module stored in said memory subsystem and executable by said processor subsystem;

said VLSI circuit design module comprising:

means for configuring a routing area for a layer of a VLSI circuit design, said routing area having a plurality of component tiles positioned thereon in a non-maximal arrangement; and means for reconfiguring said plurality of component tiles into a maximal arrangement such that said routing area is fully populated with one or more maximal component tiles and/or one or more maximal space tiles, wherein said means for reconfiguring comprises:

means for identifying pairs of spans extending across said routing area, a first one of each span pair having a different characteristic than a second one of said span pair, and means for generating one or more maximal component tiles and/or one or more maximal space tiles for said routing area based upon comparative active and inactive segments for separation between said first and second ones of said span pairs.

13. A computer program product, comprising:

a computer usable medium; and computer readable program code, encoded in said computer usable medium, for reconfiguring a non-maximal arrangement of a first plurality of component tiles within a routing area into a maximal arrangement of a second plurality of component tiles within said routing area, said computer readable program code further generating, from said non-maximal of said first plurality of component tiles, a maximal arrangement of a plurality of space tiles, said second plurality of maximal component tiles and said plurality of maximal space tiles fully populating said routing area, wherein said computer readable code comprises:

first computer readable program subcode, encoded in said computer usable medium, for characterizing active and inactive segments for a plurality of spans extending across said routing area, second computer readable program subcode, encoded in said computer usable medium, for comparing segments of said plurality of spans, and third computer readable pro gram subcode, encoded in said computer usable medium, for generating at least one maximal component tile and/or at least one maximal space tile based upon said comparison of said segments of said plurality of spans.

14. A computer system, comprising:

a memory subsystem;

a processor subsystem;

a bus subsystem, said bus subsystem coupling said memory subsystem and said processor subsystem for the exchange of signals therebetween; and a maximal tile generation module, said maximal tile generation module stored in said memory subsystem and executable by paid processor subsystem to:

characterize a first span which extends across a routing area, said routing area having a plurality of component tiles positioned thereon in a non-maximal arrangement;

identify a next span which extends across said routing area and has a characterization different from said first span;

generate one or more maximal component tiles and/or one or more maximal space tiles based upon differences between said characterization of said first span and said characterization of said next span;

recharacterize said first span based upon said generated maximal component tiles and said generated maximal space tiles; and repeatedly identify a next span, generate one or more component tiles and/or maximal space tiles and recharacterize said first span until said routing area is fully populated with maximal component tiles and maximal space tiles.

15. The computer system of claim 14, wherein said characterize a first span across said routing area further comprises identifying active and inactive segments of said first span.

16. The computer system of claim 15, wherein said generate one or more maximal component tiles and/or maximal space tiles further comprises:

identifying active and inactive segments of said next span;

for each identified active segment of said first span, determining if an active segment of said next span matches said identified active segment of said first span;

for each identified active segment of said first span not having a matching active segment in said next span, generating a maximal component tile having a width generally equal to the width of said identified active segment of said first span and a height generally equal to the distance separating said first span and said next span;

for each identified inactive segment of said first span, determining if an inactive segment of said next span matches said identified inactive segment of said first span; and for each identified inactive segment of said first span not having a matching inactive segment in said next span, generating a maximal space tile having a width generally equal to the width of said identified inactive segment of said first span and a height generally equal to the distance separating said first span and said next span.

17. The computer system of claim 16, wherein said recharacterize said first span based upon said generated maximal component tiles and said generated maximal space tiles further comprises:

deleting, from said first span, each identified active segment having a matching active segment in said next span;

adding, to said first span, each unmatched active segment of said next span;

deleting, from said first span, each identified inactive segment having a matching inactive segment in said next span; and adding, to said first span, each unmatched inactive segment of said next span.

* * * * *